Sept. 5, 1972 HIDEO WATANABE ET AL 3,689,414

METHOD OF MANUFACTURING FERROELECTRIC CERAMIC

Filed April 27, 1970 2 Sheets-Sheet 1

INVENTORS

HIDEO WATANABE

YOSHIYUKI YAGI

BY

Wenderoth, Lind and Ponack

ATTORNEYS

METHOD OF MANUFACTURING FERROELECTRIC CERAMIC

Filed April 27, 1970 2 Sheets-Sheet 2

INVENTORS
HIDEO WATANABE
YOSHIYUKI YAGI
BY
Wenderoth, Lind and Ponack
ATTORNEYS

United States Patent Office 3,689,414
Patented Sept. 5, 1972

3,689,414

METHOD OF MANUFACTURING FERROELECTRIC CERAMIC

Hideo Watanabe, Kofu, and Yoshiyuki Yagi, Mitamamachi, Nishiyashiro-gun, Japan, assignors to T.D.K. Electronics Co., Ltd., Tokyo, Japan Continuation-in-part of application Ser. No. 696,768, Jan. 10, 1968. This application Apr. 27, 1970, Ser. No. 32,014
Int. Cl. C04b *35/46, 35/48, 35/64*
U.S. Cl. 252—62.9 2 Claims

ABSTRACT OF THE DISCLOSURE

Novel $Pb(Nb_{2/3}Zn_{1/3})O_3$-$PbTiO_3$-$PbZrO_3$ compositions with superior electromechanical coupling coefficients are provided by optimization of the pre-firing temperature. The optimum pre-firing temperature is determined as a function of the stoichiometry according to the following formula $$T_p=850-3[x-0.087(2z+x-100)]\pm 10$$

wherein $T_p$ is the pre-firing temperature
$x$ is the mol percent of $Pb(Nb_{2/3}\cdot Zn_{1/3})O_5$
$z$ is the mol percent of $PbZrO_3$ This is a continuation-in-part application of copending application Ser. No. 696,768, filed Jan. 10, 1968, now abandoned.

This invention relates to a novel method of manufacturing piezoelectric ceramic.

An object of this invention is to provide a piezoelectric ceramic, which possesses an electromechanical coupling coefficient higher than those of the known piezoelectric ceramics, satisfactory large values of dielectric constant and piezoelectric modulus and sufficiently high Curie temperature which is important for a polycrystalline piezoelectric material.

Another object of this invention is to provide a piezoelectric ceramic, which is easily sintered and possesses extremely high-density as a ceramic containing lead, and therefore, exhibits desirable insulation reisistance.

Still another object of this invention is to provide a novel method of manufacturing a piezoelectric ceramic having useful ferroelectric properties as above-described, i.e., according to this invention, it is possible to obtain a piezoelectric ceramic exhibiting properties that are constant in quality of products manufactured by mass-production in the industry and that are desirable for use in various electrocommunication devices.

As is well known, single crystals such as quartz, Rochelle salts, and so forth have been employed as piezoelectric materials. They have a disadvantage in that they cannot be easily prepared or shaped. More recently, polycrytalline ferroelectric ceramics have come into use as piezoelectric materials. Several materials such as barium titanate $BaTiO_3$, potassium niobate $KNbO_3$ and so forth were discovered to be useful in production of piezoelectric ceramics. Among these materials, solid solutions of lead titanate and lead zirconate $Pb(TiZr)O_3$, both of which have a perovskite type structure, show excellent piezoelectric properties. The solid solutions of this system, which are near the morphotropic boundaries, exhibit peculiar properties, and can be employed in practical use. In this connection, some improvements on this lead titanozirconate ceramic $Pb(TiZr)O_3$ have been achieved by various modifications, such as addition of a small amount of additive, which changes the characteristic values, substitution for plumbous ions $Pb^{++}$ of other divalent ions such as $Sr^{++}$, $Ca^{++}$, etc., which improves the sintering properties, and so forth. The compositions in the ternary system consisting of the above mentioned binary system and lead stannate $PbSnO_3$, which have perovskite-type structures represents a further modification. The compositions on the morphotropic boundaries show good piezoelectric properties, but their electromechanical coupling coefficient is not sufficiently high.

Furthermore, such solid solutions as above have disadvantages in that it is rather difficult to obtain a ceramic having high density. It has been desired by the prior art that the piezoelectric ceramics have consistent characteristics and quality. Up to the present time, since characteristics of a ceramic containing lead are generally affected even by slight variation of manufacturing conditions, such piezoelectric ceramics could not be produced by mass-production.

In recent years, the demand for piezoelectric ceramics has greatly increased. Electromechanical transducers embodying such piezoelectric ceramics are employed in ultrasonic generators, audio devices, transducers of electromechanical filters, ceramic filters and so forth. Presently, the characteristics required for oscillators, which are used in non-resonance systems such as pick-up microphones in the audio range, are such that both their electromechanical coupling coefficient K and piezoelectric constant $d$ are high whereas they have a relatively low mechanical Q-value.

A feature of the present invention is directed to a novel method of manufacturing a electric ceramic composed of a ternary solid solution comprising ferroelectric lead niobo-zincate $Pb(Nb_{2/3}Zn_{1/3})O_3$ with a perovskite-type structure, lead titanate $PbTiO_3$ and lead zirconate $PbZrO_3$. This solid solution has sufficiently high values of electromechanical coupling coefficient, sufficiently high piezoelectric constant, high Curie temperature which is very important to polycrystalline piezoelectric materials.

The piezoelectric ceramic composition according to this invention is produced in the manner hereinafter described. The starting materials are powdered PbO, $TiO_2$, $ZrO_2$, $Nb_2O_5$, ZnO or the compound obtained by heating and oxidizing the corresponding metals thereof. Particularly, $Nb_2O_5$ is preferably used in the state of powder of a particle diameter less than $1\mu$. The $Nb_2O_5$ is produced by heating Nb at a temperature of less than 900° C., and preferably 600° C.

The raw materials are combined so that the composition is in the range of less than 80 mol percent of lead titanate $PbTiO_3$, less than 80 mol percent of lead zirconate $PbZrO_3$ and 0 to 100 mol percent of lead niobozincate $Pb(Nb_{2/3}Zn_{1/3})O_3$, and then said powders are mixed with water and are pre-fired at the pre-firing temperature defined or determined by the following formula based on the composition of the material to be pre-fired .

$$Tp=850-3[x-0.087(2z+x-100)]\pm 10$$

wherein:

$T_p$ is the pre-firing temperature (° C.)
$x$ is the mol percent of $Pb(Nb_{2/3}Zn_{1/3})O_3$ and
$z$ is the mole percent of $PbZrO_3$ The material is then crushed and milled into a fine powder. After a binder is added, said fine powder is pressed into a desired shape. The product thus obtained is fired again at a desired temperature according to the composition of product for 2 hours. This secondary firing is performed in a closed furnace. After setting a pair of electrodes on both sides of the fired disk-shaped product, the product is polarized by applying D.C. voltage of 3000~4500 v./mm. in a silicone oil bath at 80°~140° C.

Appended drawings and exemplary but not limitative embodiments are described in the following:

FIG. 1 and FIG. 2 are three component diagrams showing the relationship between the contents of $Pb(Nb_{2/3}Zn_{1/3})O_3$, $PbTiO_3$ and $PbZrO_3$ which are the three components in this invention.

EXAMPLE I

Raw materials which are essentially chemically pure were used. PbO, $TiO_2$, $ZrO_2$, $Nb_2O_5$ and ZnO were provided so that the final composition was:

| | Mol percent |
|---|---|
| $Pb(Nb_{2/3}Zn_{1/3})O_3$ | 10 |
| $PbTiO_3$ | 42 |
| $PbZrO_3$ | 48 |

These materials were wet-mixed in a ball mill for 24 hours. In this case, powder of $Nb_2O_3$ of a particle diameter less than 1μ (which was obtained by heating at the temperature less than 900° C.) was used. The mix was then prefired at 820° C. in air for 2 hours. The product was ground into powder of a particle diameter less than 1μ. Then, an appropriate binder being added, the powder mixture thus obtained was pressed into a disk of 16 mm. in diameter and 1 mm. in thickness, and fired again at 1230° C. for 2 hours. This secondary firing was performed in a closed furnace to prevent evaporation of PbO at the high temperature during the secondary firing. The sintered disk-shaped product was used as a piezoelectric body, after having been polarized by a conventional method, for instance by applying 4000 v./mm. static electric field between a pair of electrodes set on both sides of the disk in a silicone oil bath at 120° C.

The characteristic values of the piezoelectric ceramics thus obtained are:

Density—ρ: 7.85 g./cm.$^3$
Radial electromechanical coupling coefficient—Kr: 71.5%
Mechanical Q value—Qm: 72
Specific dielectric constant—ε: 1400

EXAMPLE II

Raw materials were the same in Example I. PbO, $TiO_2$ $ZrO_2$, $Nb_2O_5$ and ZnO were provided so that the final composition was:

| | Mol percent |
|---|---|
| $Pb(Nb_{2/3}Zn_{1/3})O_3$ | 30 |
| $PbTiO_3$ | 34.5 |
| $PbZrO_3$ | 35.5 |

These materials were wet-mixed in a ball mill for 24 hours as indicated in Example I, and then pre-fired at 760° C. in air for 2 hours. The product was gound into powder of a particle diameter less than 1μ. Then, an appropriate binder being added, the powder mixture thus obtained was pressed into a disk of 16 mm. in diameter and 1 mm. in thickness, and fired again at 1220° C. for 2 hours. This secondary firing was performed in a closed furnace to prevent evaporation of PbO at the high temperature during the secondary firing. The sintered disk-shaped product was used as a piezoelectric body, after having been polarized by a conventional method, for instance, by applying 4500 v./mm. static electric field between a pair of electrodes set on both sides of the disk in a silicone oil bath at 140° C.

The characteristic value of the piezoelectric ceramics thus obtained are:

Density—ρ: 7.94 g./cm.$^3$
Radical electrometchanical coupling coefficient—Kr: 75.6
Mechanical Q value—Qm: 67
Specific dielectric constant—ε: 1870

EXAMPLE III

Raw materials were the same in Example I. PbO, $TiO_2$, $ZrO_2$, $Nb_2O_5$ and ZnO were provided so that the final composition might be:

| | Mol percent |
|---|---|
| $Pb(Nb_{2/3}Zn_{1/3})O_3$ | 50 |
| $PbTiO_3$ | 26 |
| $PbZrO_3$ | 24 |

These materials were wet-mixed in a ball mill for 24 hours as indicated in Example I, and then pre-fired at 700° C. in air for 2 hours. The product was ground into powder of a particle diameter less than 1μ. Then an appropriate binder being added, the powder mixture thus obtained was pressed into a disk of 16 mm. in diameter and 1 mm. in thickness, and fired again at 1100° C. for 2 hours. This secondary firing was performed in a closed furnace to prevent evaporation of PbO at the high temperature during the secondary firing. The sintered disk-shaped product was used as a piezoelectric body, after having been polarized by a conventional method, for instance by applying 4000 v./mm. static electric field between a pair of electrodes set on both sides of the disk in a silicone oil bath at 120° C.

The characteristic values of the piezoelectric ceramics thus obtained are:

Density—ρ: 8.02 g./cm.$^3$
Radial electrochemical coupling coefficient—Kr: 76.1%
Mechanical Q value—Qm: 60
Specific dielectric constant—ε: 2010

Table 1 shows the characteristic values of ceramic bodies according to this invention in various compositions obtained by essentially the same process as the above-mentioned examples.

TABLE 1

[$x=Pb(Nb_{2/3}.Zn_{1/3})O_3$, $y=PbTiO_3$, $z=PbZrO_3$ composition]

| Specimen No. | Component (mol percent) | | | ρ cm.$^3$ (g./cm.$^3$) | Kr (percent) | Qm | ε |
|---|---|---|---|---|---|---|---|
| | x | y | z | | | | |
| 1 | 1 | 42 | 57 | 7.51 | 45.1 | 150 | 545 |
| 2 | 1 | 48 | 51 | 7.60 | 48.2 | 120 | 950 |
| 3 | 1 | 52 | 47 | 7.52 | 45.0 | 145 | 550 |
| 4 | 10 | 10 | 80 | 7.75 | 22.6 | 350 | 350 |
| 5 | 10 | 25 | 65 | 7.75 | 36.2 | 140 | 580 |
| 6 | 10 | 33 | 57 | 7.75 | 47.0 | 135 | 605 |
| 7 | 10 | 41 | 49 | 7.76 | 66.0 | 79 | 960 |
| 8 | 10 | 42 | 48 | 7.85 | 71.5 | 72 | 1,400 |
| 9 | 10 | 43 | 47 | 7.78 | 70.7 | 72 | 1,590 |
| 10 | 10 | 44 | 46 | 7.79 | 64.1 | 79 | 1,580 |
| 11 | 10 | 52 | 38 | 7.78 | 47.5 | 130 | 860 |
| 12 | 10 | 65 | 25 | 7.78 | 30.6 | 350 | 360 |
| 13 | 10 | 80 | 10 | 7.77 | 26.4 | 370 | 310 |
| 14 | 10 | 1 | 80 | 7.68 | 16.2 | 275 | 360 |
| 15 | 19 | 80 | 1 | 7.66 | 15.9 | 370 | 345 |
| 16 | 19 | 25 | 55 | 7.79 | 43.5 | 140 | 580 |
| 17 | 20 | 36 | 44 | 7.85 | 66.0 | 85 | 860 |
| 18 | 20 | 37 | 43 | 7.87 | 70.7 | 78 | 1,030 |
| 19 | 20 | 38 | 42 | 7.87 | 73.2 | 70 | 1,490 |
| 20 | 20 | 39 | 41 | 7.86 | 71.5 | 272 | 1,790 |
| 21 | 20 | 65 | 15 | 7.83 | 26.7 | 270 | 375 |
| 22 | 30 | 32.5 | 37.5 | 7.94 | 69.8 | 84 | 955 |
| 23 | 20 | 33.5 | 36.5 | 7.95 | 76.1 | 81 | 1,340 |
| 24 | 30 | 34.5 | 35.5 | 7.94 | 77.1 | 67 | 1,870 |
| 25 | 40 | 1 | 59 | 7.89 | 27.0 | 255 | 395 |
| 26 | 40 | 15 | 45 | 7.89 | 38.4 | 175 | 630 |
| 27 | 40 | 30.5 | 29.5 | 7.99 | 74.2 | 67 | 1,710 |
| 28 | 40 | 31.5 | 28.5 | 8.01 | 76.1 | 58 | 1,950 |
| 29 | 40 | 32.5 | 27.5 | 8.00 | 73.0 | 66 | 2,280 |
| 30 | 40 | 55 | 5 | 7.98 | 32.5 | 240 | 590 |
| 31 | 50 | 18 | 32 | 8.01 | 49.8 | 110 | 1,450 |
| 32 | 50 | 26 | 24 | 8.02 | 76.1 | 60 | 2,010 |
| 33 | 50 | 33 | 17 | 8.00 | 50.2 | 135 | 1,380 |
| 34 | 50 | 49 | 1 | 7.98 | 29.7 | 240 | 780 |
| 35 | 60 | 1 | 39 | 8.00 | 30.0 | 310 | 490 |
| 36 | 60 | 15 | 25 | 8.08 | 40.1 | 185 | 980 |
| 37 | 60 | 25 | 15 | 8.11 | 68.9 | 80 | 2,025 |
| 38 | 60 | 39 | 1 | 8.08 | 37.8 | 320 | 850 |
| 39 | 75 | 20 | 5 | 8.12 | 52.0 | 195 | 2,100 |
| 40 | 75 | 24 | 1 | 8.14 | 47.5 | 205 | 1,890 |
| 41 | 87 | 12 | 1 | 8.11 | 49.7 | 205 | 875 |

NOTE.—Polarization conditions, 80°~140° C., 3,000~4,500 v./mm.

Table 1 shows the characteristic values of ceramic bodies according to this invention in various compositions obtained by essentially the same process as the above-mentioned examples. The composition in mole ratio of sample described as $x\text{Pb}(\text{Nb}_{2/3}\text{Zn}_{1/3})\text{O}_3$—$y\text{PbTO}_3$—$z\text{PbZrO}_3$, where $x+y+z=100$, is given in each column of $x$, $y$ and $z$, and the characteristic values, from left to right, correspond to density of the body $\rho$ (g./cm.$^3$); radial electromechanical coupling coefficient Kr (percent); mechanical Q value QM; dielectric constant $\epsilon$, respectively.

As is apparent from the above-mentioned examples and Table 1, the piezoelectric ceramic produced by the method of this invention is composed of a ternary solid solution comprising ferroelectric lead niobo-zincate $$\text{Pb}(\text{Nb}_{2/3}\text{Zn}_{1/3})\text{O}_3$$

and the pre-firing temperature is defined by the following formula:

$$T_p=850-3[x-0.087(2z+x-100)]\pm 10$$

wherein:

$T_p$: the pre-firing temperature (° C.)
$x$: mol percent number of $\text{Pb}(\text{Nb}_{2/3}\cdot\text{Zn}_{1/3})\text{O}_3$
$z$: mol percent number of $\text{PbZrO}_3$ therefore, electric properties, particularly, electromechanical coupling coefficient are sufficiently high, achieving values of as high as 77% by using this novel method. Furthermore, according to the method of this invention, the density of a ceramic reaches so much as 8 g./cm.$^3$, which is much the same as the theoretical value. This permits the ceramic of high density to be sintered. (For example, from X-ray studies, it is found that a theoretical value of density of this ceramic is nearly 8.08 g./cm.$^3$). These features shall be understood from the following Table 2, in which there is shown a ratio of the actual density $\rho_0$ of the piezoelectric ceramic $$x\text{Pb}(\text{Zn}_{1/3}\cdot\text{Nb}_{2/3})\text{O}_3-y\text{PbTiO}_3-z\text{PbZrO}_3$$

to the theoretical density $\rho_t$. (It is actually impossible to attain a ratio of 100%.)

TABLE 2

| | Component | | | |
|---|---|---|---|---|
| Number | $x$ | $y$ | $z$ | $\rho_0/\rho_t$X100 |
| 1 | 0 | 45 | 55 | 90.0 |
| 2 | 1 | 45 | 54 | 95.0 |
| 3 | 10 | 44 | 46 | 97.0 |
| 4 | 20 | 39 | 41 | 97.3 |
| 5 | 30 | 35 | 35 | 97.5 |
| 6 | 40 | 40 | 20 | 98.0 |
| 7 | 50 | 27. | 23 | 98.0 |
| 8 | 60 | 22 | 18 | 97.9 |
| 9 | 70 | 18 | 12 | 98.0 |

In Table 2, data of specimen No. 1 is obtained from the literature. As apparently from the Table 2, dual composition comprising lead titanate $\text{PbTiO}_3$ and lead zirconate $\text{PbZrO}_3$ has only 90.0% of theoretical density, whereas addition of only 1 mol percent of lead niobozincate $\text{Pb}(\text{Nb}_{2/3}\text{Zn}_{1/3})\text{O}_3$ greatly improves the ratio to 95%. Addition of 10 mol percent of $\text{Pb}(\text{Nb}_{2/3}\cdot\text{Zn}_{1/3})\text{O}_3$ changes the ratio to 97.0%, and the more the amount of this solid solution is contained, the higher the density of the ceramic is realized.

High density of a ceramic is very important in such polycrystalline piezoelectric material because it is possible to obtain a superior insulating resistance against voltage and easy polarization, i.e., conventional ceramics are polarized at a temperature 80° C.~100° C. and the insulating resistance against voltage would not permit the temperature to be higher than that because if the temperature is too high, it causes dielectric breakdown. This invention avoids such disadvantages and permits polarization at temperatures of more than 120° C. to 140° C., which enables one to select any desirable temperature according to each composition point. Therefore, its electromechanical coupling coefficient becomes extremely high. It is possible to approximate the values of electric properties, i.e., electromechanical coupling coefficient and dielectric constant to theoretical values. It is also improved in moisture resistant properties and specific resistance as well as constant electric properties such as frequency characteristics.

Figure 1:
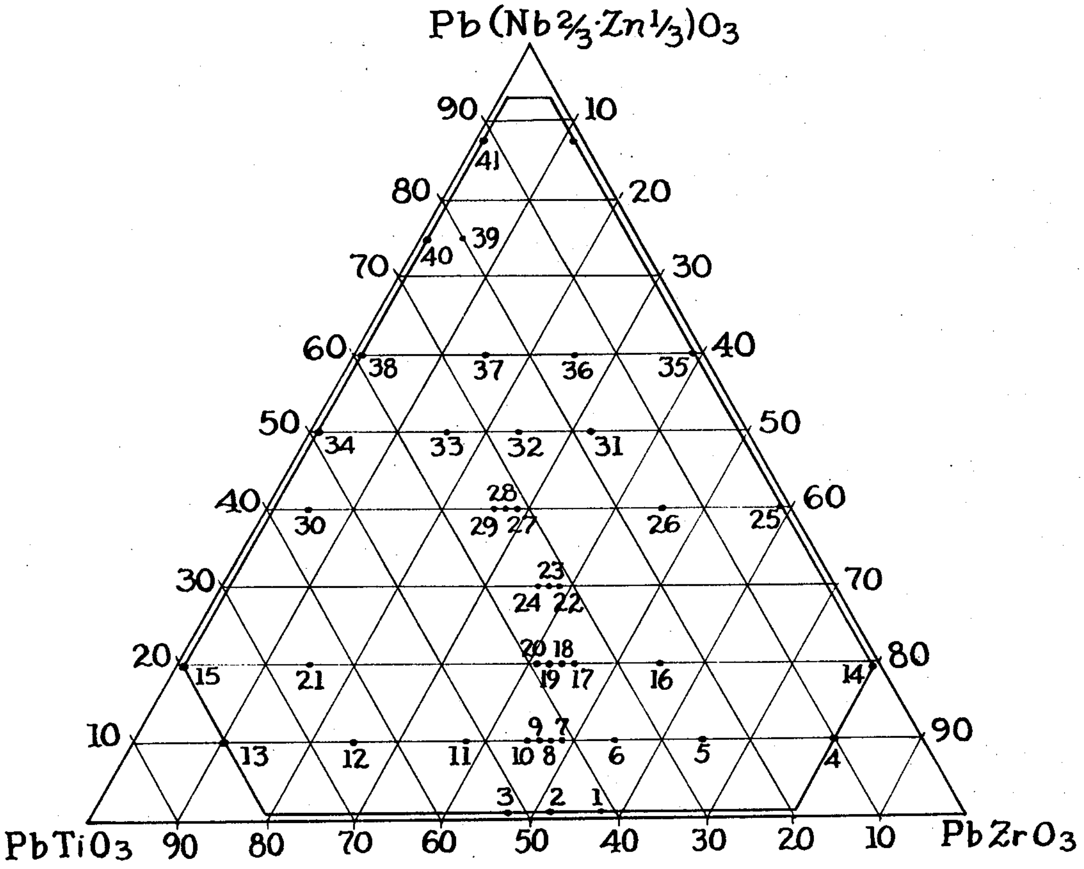
FIG. 1 is three-component diagram showing the relationship between the contents of $\text{Pb}(\text{Nb}_{2/3}\text{Zn}_{1/3})\text{O}_3$, $\text{PbTiO}_3$, $\text{PbZrO}_3$ which are the three components in this invention and point numbers in a diagram are corresponding to specimen numbers of Table 1.
Figure 2:
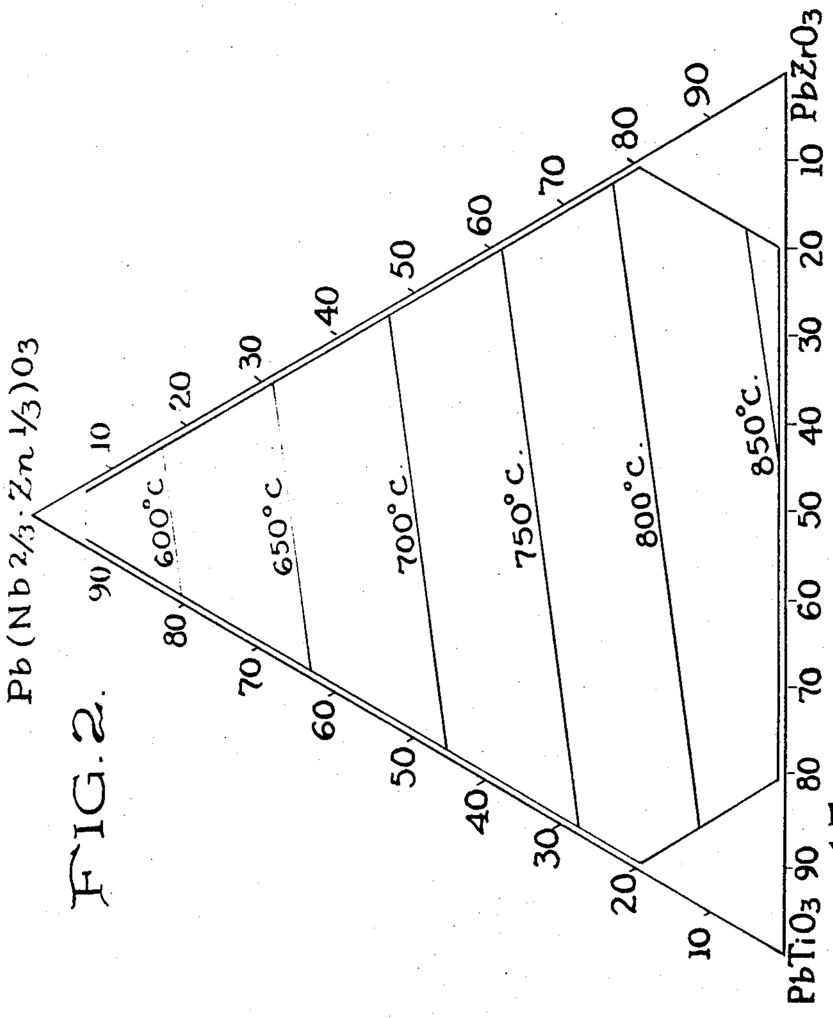
FIG. 2 is three component diagram showing the prefiring temperature defined by the above formula defining $T_p$.

What we claim is:

1. A method of manufacturing piezoelectric ceramic consisting essentially of the composition expressed by the formula $$\text{Pb}[(\text{Nb}_{2/3}\cdot\text{Zn}_{1/3})_x\text{Ti}_y\text{Zr}_z]\text{O}_3$$

wherein $$0.01\leqq x\leqq 0.95 \quad 0.01\leqq y\leqq 0.8 \quad 0.01\leqq z\leqq 0.8$$

and $x+y+z=1$; comprising mixing powdered Pb, Zn, Ti and Zr or their oxides with powdered $\text{Nb}_2\text{O}_5$ produced by heating Nb at less than 900° C.; pre-firing at the temperature determined by the following formula:

$$T_p=850-3[x-0.087(2z+x-100)\pm 10$$

wherein $T_p$ is the pre-firing temperature
$x$ is the mol percent of $\text{Pb}(\text{Nb}_{2/3}\cdot\text{Zn}_{1/3})\text{O}_3$
$z$ is the mol percent of $\text{PbZrO}_3$ crushing and milling into a fine powder; admixing a binder; pressing said fine powder and binder mixture into a desired shape, firing said shape in a closed furnace at a temperature of about 1100° C. to about 1230° C., and polarizing said shaped product.

2. A process according to claim 1 wherein the $\text{Nb}_2\text{O}_5$ has a particle size of less than 1$\mu$.

References Cited

UNITED STATES PATENTS 3,403,103 9/1968 Ovchi et al. ........ 252—62.9

TOBIAS E. LEVOW, Primary Examiner

J. COOPER, Assistant Examiner

U.S. Cl. X.R.

106—39 R